US010269951B2

(12) United States Patent
Losee et al.

(10) Patent No.: US 10,269,951 B2
(45) Date of Patent: Apr. 23, 2019

(54) SEMICONDUCTOR DEVICE LAYOUT AND METHOD FOR FORMING SAME

(71) Applicant: General Electric Company, Schenectady, NY (US)

(72) Inventors: Peter Almern Losee, Clifton Park, NY (US); Alexander Bolotnikov, Niskayuna, NY (US); Stacey Joy Kennerly, Niskayuna, NY (US); James William Kretchmer, Ballston Spa, NY (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 18 days.

(21) Appl. No.: 15/596,977

(22) Filed: May 16, 2017

(65) Prior Publication Data

US 2018/0337273 A1    Nov. 22, 2018

(51) Int. Cl.
| | |
|---|---|
| H01L 29/06 | (2006.01) |
| H01L 29/36 | (2006.01) |
| H01L 29/16 | (2006.01) |
| H01L 29/20 | (2006.01) |
| H01L 21/265 | (2006.01) |
| H01L 21/266 | (2006.01) |
| H01L 29/78 | (2006.01) |
| H01L 29/10 | (2006.01) |
| H01L 29/08 | (2006.01) |

(52) U.S. Cl.
CPC ...... *H01L 29/7811* (2013.01); *H01L 29/1083* (2013.01); *H01L 29/1095* (2013.01); *H01L 29/0865* (2013.01)

(58) Field of Classification Search
CPC ............. H01L 29/7811; H01L 29/1083; H01L 29/1095; H01L 29/0865
See application file for complete search history.

(56) References Cited

U.S. PATENT DOCUMENTS

| | | | |
|---|---|---|---|
| 5,341,011 A * | 8/1994 | Hshieh | H01L 29/1095 257/330 |
| 5,701,023 A | 12/1997 | Bulucea et al. | |
| 6,979,863 B2 | 12/2005 | Ryu | |
| 8,461,632 B2 | 6/2013 | Tsuchiya et al. | |
| 8,674,439 B2 | 3/2014 | Sdrulla et al. | |
| 8,786,024 B2 | 7/2014 | Sugawara | |

(Continued)

OTHER PUBLICATIONS

Schomer et al. "Significantly Improved Performance of MOSFETs on Silicon Carbide Using the 15R-SiC Polytype", IEEE Electron Device Letters, vol. 20 Issue 5, pp. 241-244, May 1999.

(Continued)

*Primary Examiner* — Changhyun Yi
(74) *Attorney, Agent, or Firm* — GE Global Patent Operation; John P. Darling

(57) ABSTRACT

A semiconductor device is provided. The semiconductor device includes a semiconductor device layer having silicon carbide and having an upper surface and a lower surface. The semiconductor device also includes a heavily doped body region formed in the upper surface of the semiconductor device layer. The semiconductor device further includes a gate stack formed adjacent to and on top of the upper surface of the semiconductor device layer, wherein the gate stack is not formed adjacent to the heavily doped body region.

5 Claims, 9 Drawing Sheets

(56) References Cited

U.S. PATENT DOCUMENTS

| | | | |
|---|---|---|---|
| 2001/0053581 A1* | 12/2001 | Mosher | H01L 29/66659 438/297 |
| 2006/0186467 A1* | 8/2006 | Pendharkar | H01L 27/088 257/337 |
| 2009/0072308 A1* | 3/2009 | Chen | H01L 29/42368 257/336 |
| 2009/0159896 A1 | 6/2009 | Arthur et al. | |
| 2011/0127602 A1* | 6/2011 | Mallikarjunaswamy | H01L 21/823807 257/331 |
| 2013/0026559 A1 | 1/2013 | Arthur et al. | |
| 2014/0159141 A1 | 6/2014 | Arthur et al. | |
| 2015/0155355 A1* | 6/2015 | Losee | H01L 29/1608 257/77 |
| 2015/0287820 A1* | 10/2015 | Mallikarjunaswamy | H01L 29/456 257/341 |
| 2015/0340487 A1 | 11/2015 | Siemieniec et al. | |

OTHER PUBLICATIONS

"1200V SiC MOSFETs", ROHM Semiconductor, http://www.rohm.com/web/eu/sic-mosfet, 2003.
"Power Transistor Driver", ip.com, https://priorart.ip.com/IPCOM/000228040, Jan. 4, 2013.
"Next Generation Power Semiconductors", Sanken Electric Co Ltd, http://www.semicon.sanken-ele.co.jp/en/guide/GaNSiC.html, 2013.

\* cited by examiner

US 10,269,951 B2

SEMICONDUCTOR DEVICE LAYOUT AND METHOD FOR FORMING SAME

BACKGROUND

The subject matter disclosed herein relates to semiconductor devices, and more particularly, to a semiconductor device layout to improve device reliability and robustness.

Power conversion devices are widely used throughout modern electrical systems to convert electrical power from one form to another form for consumption by a load. Many power electronics systems utilize various semiconductor devices and components, such as thyristors, diodes, and various types of transistors (e.g., metal-oxide-semiconductor field-effect transistor (MOSFETs), junction gate field-effect transistor (JFETs), insulated gate bipolar transistors (IGBTs), and other suitable transistors, in this power conversion process.

Generally, when a semiconductor device is conducting current, the on-state resistance of the semiconductor device represents its conduction loss, which impacts the efficiency of the power conversion system and its cost. To reduce the on-state resistance and conduction losses of the semiconductor device, the dopant concentration of various regions of the semiconductor device, such as the source regions, well regions, and/or body regions, may be increased. However, regions of high dopant concentration may degrade the certain properties of semiconductors, such as silicon carbide (SiC), which may worsen the reliability of portions of the semiconductor device, such as gate oxide layers. Accordingly, it may be desirable to develop semiconductor device layouts that improve device reliability without substantially diminishing device performance.

BRIEF DESCRIPTION

In one embodiment, a semiconductor device is provided. The semiconductor device comprises a semiconductor device layer having a source region and a heavily doped body region formed in the semiconductor device layer. The semiconductor device further comprises a gate dielectric layer disposed between the semiconductor device layer and a gate electrode. The semiconductor device also comprises a dielectric layer disposed above the gate electrode. Still further, the semiconductor device comprises a gate stack comprising a portion of the gate dielectric layer and a portion of the gate electrode, wherein the gate stack is formed adjacent to a source region and wherein the gate stack is not formed adjacent to the heavily doped body region.

In another embodiment, a semiconductor device, comprising a semiconductor device layer is provided. The semiconductor device also comprises a body region formed in the semiconductor device layer. The semiconductor device further comprises a dielectric layer disposed between the semiconductor layer and a gate electrode, wherein a thickness of a portion of the dielectric layer disposed above the body region is greater than about 0.5 µm.

In another embodiment, a semiconductor device, comprising a substrate is provided. The semiconductor device further comprises a first stripe of cells arranged in a longitudinal direction through an active region formed on the substrate, wherein each cell of the first stripe of cells comprises a heavily doped body region. The semiconductor device also comprises a second stripe of cells formed parallel to the first stripe of cells through the active region formed on the substrate, wherein the second stripe of cells is spaced laterally from the first stripe of cells, and wherein each cell of the second stripe of cells comprises a heavily doped body region. Further, the semiconductor device comprises a termination region having a heavily doped region formed proximal to an end of each of the first and second stripe of cells and spaced at a longitudinal body region to edge spacing ($\phi$), wherein the heavily doped body region of each cell in the first stripe of cells is spaced at a lateral body region spacing ($\lambda$) from a respective heavily doped body region of each cell in the second stripe of cells, and wherein the longitudinal body region to edge spacing ($\phi$) is less than or equal to the lateral body region spacing ($\lambda$).

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
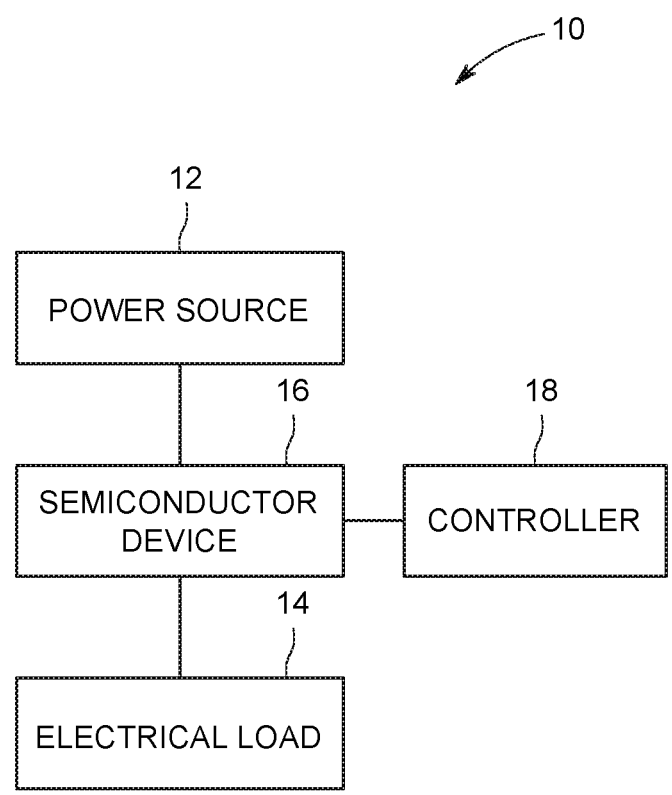
FIG. 1 is a block diagram of a power electronics system including a semiconductor device, in accordance with an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Unless defined otherwise, technical and scientific terms used herein have the same meaning as is commonly understood by one of ordinary skill in the art to which this disclosure belongs. The terms "first," "second," and the like, as used herein do not denote any order, quantity, or importance, but rather are used to distinguish one element from another. Also when introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. If ranges are disclosed, the endpoints of all ranges directed to the same component or property are inclusive and independently combinable. The modifier "approximately" used in connection with a quantity is inclusive of the stated value and has the meaning dictated by the context (e.g., includes the degree of process variations or errors associated with measurement of the particular quantity).

As used herein, the term "layer" refers to a material disposed on at least a portion of an underlying surface in a continuous or discontinuous manner. Further, the term "layer" does not necessarily mean a uniform thickness of the disposed material, and the disposed material may have a uniform or a variable thickness unless otherwise specified. Furthermore, the term "a layer" as used herein refers to a single layer or a plurality of layers, unless the context clearly dictates otherwise. Further, as used herein, the phrases "disposed on," "sputtered on," or "deposited on" refer to layers disposed directly in contact with each other or indirectly by having intervening layers there between, unless otherwise specifically indicated. The term "adjacent" as used herein means that the two layers are disposed contiguously and are in direct contact with each other. Further, the term "on" describes the relative position of the layers/regions to each other and does not necessarily mean "on top of" since the relative position above or below depends upon the orientation of the device to the viewer. Moreover, the use of "top," "bottom," "above," "below," "upper", and variations of these terms is made for convenience, and does not require any particular orientation of the components unless otherwise stated. With this in mind, as used herein, the terms "lower," "middle," or "bottom" refer to a feature that is relatively nearer the substrate layer, while the terms "top" or "upper" refer to the particular feature that is relatively the farthest from the substrate layer.

Various semiconductor devices may be included in power conversion systems to control the flow of current in a circuit. In particular, a semiconductor device, such as transistor (e.g., a metal-oxide-semiconductor field-effect transistor (MOSFET) or Insulated Gate Bipolar Transistors (IGBTs)), may be switched between a conducting state in which current flows through the semiconductor device and a non-conducting state in which the flow of current through the semiconductor device is blocked. The semiconductor device may be associated with an on-state resistance that represents the electrical resistance of the semiconductor device to switching from the non-conducting state to the conducting state. The various regions of the semiconductor device may each have an associated resistance, and the on-state resistance of the semiconductor device may be the sum of each of these resistances. Decreasing the on-state resistance may decrease the conduction losses of the semiconductor device and may increase the efficiency of the power conversion system.

To reduce the on-state resistance and conduction losses of a semiconductor device, the dopant concentration of some regions of the semiconductor device may be increased. For example, the dopant concentration of the source regions and body regions may be increased to reduce the source contact resistance of the semiconductor device. Additionally, increasing the dopant concentration of various doped regions not in the active cell areas, such as along the periphery of the device (e.g., the termination region) and doped regions under the gate pad and gate bus area of the semiconductor device, may increase the robustness of the semiconductor device under avalanche breakdown and/or parasitic latch-up. For example, low resistance regions maintain a balanced potential (dynamically and statically) across the device, preventing localized breakdown and heating associated with dissipated losses. High doping concentrations are also used in these regions to prevent parasitic channel formation from high potential differences between metal layers and the underlying semiconductor diffused or implanted regions. Heavily doped p-type regions in these regions can also add to integral body diode injection area of MOSFETs, helping to lower the forward voltage drop and surge current capability of the integral diode. However, regions of high dopant concentration, such as heavily doped p-type regions, may degrade the surface of certain semiconductors, such as silicon carbide (SiC). These regions can also add processing complexity when dealing with doping compensation and often times the source region (of opposite type) must be etched away, resulting in reduced surface planarity or surface defects.

Many modern semiconductor devices rely on a relatively thin gate oxide layer to electrically isolate the gate electrode from other components of the semiconductor device structure. In particular, for semiconductor devices having low inversion channel mobility, such as SiC semiconductor devices, a thin (e.g., less than approximately 80 nanometer (nm)) gate oxide may be used while operating at electric fields greater than 3 megavolts/centimeter (MV/cm) to maximize channel conduction. Further, the ratio of dielectric constants between the semiconductor and the gate oxide amplifies the electric field strength component normal to the surface by the ratios of the relative permittivities. This generated electric field may be supported over planar regions of the semiconductor device. However, the electric field may be locally increased in non-planar portions of the semiconductor device, such as surface defects caused by heavily doped regions, which may reduce the reliability of the gate oxide and as a result the reliability and lifetime of the semiconductor device.

With the foregoing in mind, present embodiments are directed toward improving the reliability in semiconductor devices, such as SiC MOSFET devices, without sacrificing device performance, such as robustness, body diode performance and switching efficiency. For example, as set forth below, a semiconductor device may include heavily doped source regions and body regions to reduce ohmic contact resistance (e.g., provide good body contact) and source resistance. Additionally, the semiconductor device may include heavily doped, regions connecting the active region to the termination region of the semiconductor device and in the regions of the semiconductor device below the gate pad and gate bus areas to increase the robustness of the semiconductor device. As discussed below, certain embodiments maintain the reliability of the gate oxide layer without sacrificing device performance by utilizing device layouts wherein the thin gate oxide layer is not disposed on and/or adjacent to the heavily doped body regions or the heavily doped, peripheral regions near the termination region and gate regions (e.g., gate pad bond and routing regions) of the semiconductor device. Certain embodiments maintain the reliability of the gate oxide layer by providing device layouts wherein the gate oxide layer is not disposed on and adjacent to any regions of the semiconductor device having higher dopant concentration compared to the source regions of the semiconductor device. In certain embodiments, the regions of the semiconductor device having the highest dopant concentration may include the body regions, peripheral p+ regions near the termination region, and/or the heavily doped regions in the gate bond pad or routing (or bus) regions.

Further, as discussed below, certain embodiments maintain the reliability of the gate oxide layer by maintaining the planarity of the semiconductor surface throughout the device (e.g., the active region, the termination region, and the gate region). For example, implanted regions having a first conductivity type (e.g., n-type) may have heavily doped body regions that have a second conductivity type (e.g., p-type), formed therein. As discussed below, these implanted regions having the first conductivity type may be formed using a lower dopant concentration than that of the body regions, and the heavily doped body regions and may be formed by counter-doping at a relatively higher dopant concentration. In this manner, some areas of the heavily doped body regions may be formed by fully compensating the implanted regions of the first conductivity type, rather than by etching to remove portions of the first conductivity type implanted regions, which may reduce the surface planarity.

Still further, as discussed below, certain embodiments improve the reliability of the gate oxide layer, as well as improve the robustness of the semiconductor device to avalanche breakdown, by providing device layouts that reduce the probability of formation of avalanche points near the ends of the stripe cells (e.g., longitudinal cells) of the semiconductor device. In particular, the ends (e.g., longitudinal ends) of the stripe cells may be terminated or integrated with other functional regions of the semiconductor device, such as the termination region or gate region. In some conventional semiconductor devices, the heavily doped body region (or the last body segment) of a stripe cell may extend from the active region to another functional region, such as the termination region or gate pad or routing region, to provide low impedance connection of these regions preventing the localization of phenomenon like avalanche breakdown or dynamic losses under switching conditions. That is, the heavily doped body region may be continuous with the heavily doped region in the termination region or other functional regions that are not part of the active conducting cell area, herein referred to as "inactive" regions. However, in this device layout, the gate oxide layer may be disposed on and adjacent to the heavily doped, body region or body segment in the inactive region, which may reduce the reliability of the gate oxide. Accordingly, as discussed below, to maintain the reliability of the gate oxide layer, the heavily doped body region (or last body segment) of each cell may be spaced apart from a heavily doped region in a termination region or other functional region (e.g., the gate pad/bus regions etc.) of the semiconductor device by a distance (e.g., a longitudinal distance). Additionally, to reduce the probability of formation of avalanche points near the asymmetries where the stripe cells are terminated, the distance (e.g., longitudinal distance) between the body region (or last body segment) of each stripe cell and the heavily doped region in an inactive region a termination region or other functional region may be approximately less than or equal to the spacing (e.g., a lateral distance) between the body regions (or body segments) in adjacent or neighboring stripe cells.

It should be appreciated that while the present technique is discussed herein in the context of metal-oxide-semiconductor field-effect transistors (MOSFETS), some of the present techniques may be applicable to other types of semiconductor device structures, such as, transistors (e.g., insulated gate bipolar transistor (IGBT), bipolar, etc.) or any other suitable device utilizing metallization. Further, semiconductor devices of the present approach may be manufactured from any suitable semiconductor materials, such as silicon (Si), silicon carbide (SiC), germanium (Ge), aluminum nitride (AlN), gallium nitride (GaN), gallium arsenide (GaAs), diamond (C), for example.

With the foregoing in mind, FIG. 1 illustrates a block diagram of an embodiment of a power electronics system 10 (e.g., a power conversion system, a switching system, etc.). The power electronics system 10 may include a power source 12, an electrical load 14, at least one semiconductor device 16 (e.g., a switching device), and a controller 18 (e.g., an electronic control unit). The power source 12 may include an alternating current (AC) power source or a direct current (DC) power source. In some embodiments, the power source 12 may include a power grid, an electrical generator, a battery, or the like. The power source 12 may be electrically connected to the semiconductor device 16 and may supply electrical current (e.g., AC current or DC current) to the semiconductor device 16. Additionally, the at least one semiconductor device 16 may be electrically connected to the electrical load 14 and may supply electrical current (e.g., AC current or DC current) to the electrical load 14. The electrical load 14 may include a DC load or an AC load. In certain embodiments, the electrical load 14 may be configured to store the electrical power and/or to use the electrical power to perform an operation. For example, the electrical load 14 may include a battery, a computer, an electric motor, or the like.

The semiconductor device 16 may be communicatively coupled to the controller 18 via one or more wired and/or wireless connections. In some embodiments, the controller 18 may include one or more processors and one or more memory devices (e.g., tangible, non-transitory, computer-readable media) storing instructions executable by the one or more processors. In certain embodiments, the controller 18 may include logic arrays and/or control circuitry. The controller 18 may be configured to switch the semiconductor device 16 between a conducting state (e.g., an on state) and a non-conducting state (e.g., an off state). Further, the semiconductor device 16 may be configured to control the flow of electrical current from the power source 12 to the electrical load 14. In particular, the semiconductor device 16 may allow or enable current to flow from the power source 12 to the electrical load 14 when the semiconductor device 16 is in the conducting state. Additionally, the semiconductor device 16 may block the flow of current from the power source to the electrical load 14 when the semiconductor device 16 is in the non-conducting state. In some embodiments, the controller 18 may be configured to control the semiconductor device 16 to convert AC current from the power source 12 into DC current.

Figure 2:
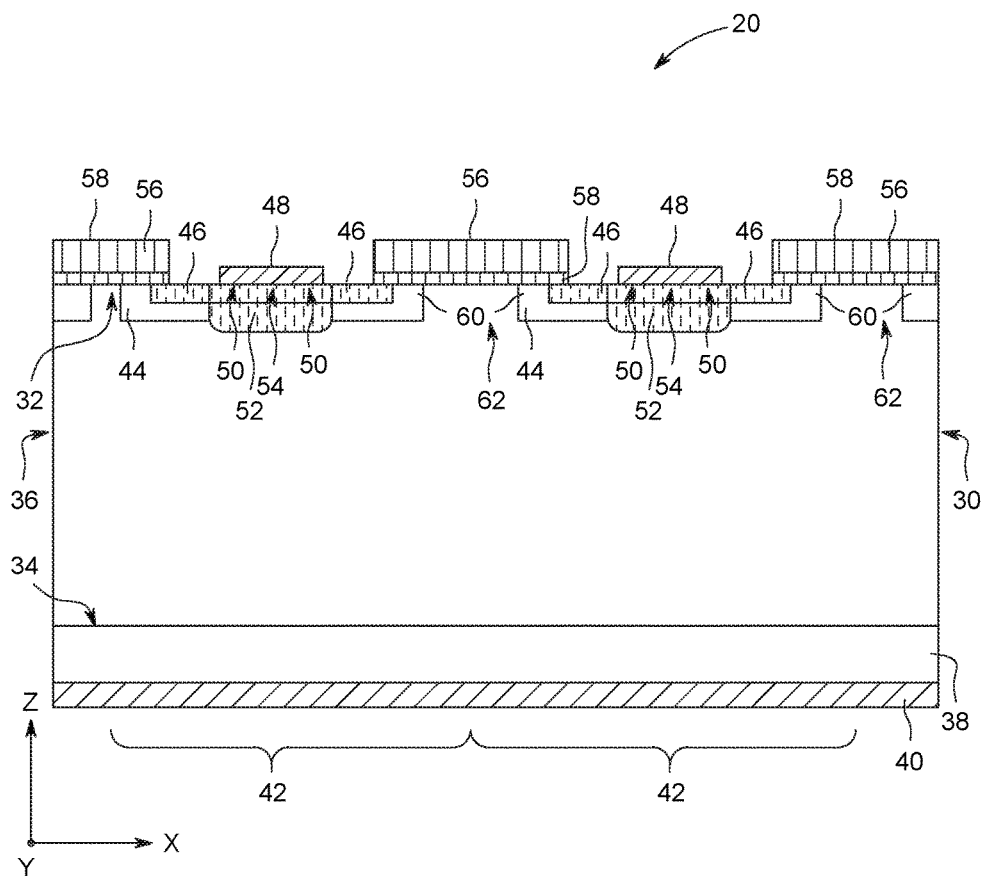
FIG. 2 is a schematic cross-section of a semiconductor device, in accordance with an embodiment of the present disclosure.

FIG. 2 is a partial cross-sectional view of an embodiment of a semiconductor device 16 that may be used in the power electronics system 10 of FIG. 1. In particular, the semiconductor device 16 illustrated in FIG. 2 is a planar n-channel double implanted metal oxide semiconductor field effect transistor (DMOSFET), hereinafter referred to as the MOSFET device 20. It may be appreciated that, in order to more clearly illustrate certain components of the MOSFET device 20, certain design elements of the MOSFET device 20 (e.g., top metallization, passivation, edge termination, and so forth) may be omitted.

The illustrated MOSFET device 20 of FIG. 2 includes a semiconductor device layer 30 (e.g., an epitaxial SiC layer) having a first surface 32 (e.g., a top surface or an upper surface) and a second surface 34 (e.g., a bottom surface or a lower surface). The semiconductor device layer 30 includes a drift region 36 having a first conductivity type (e.g., an n-type drift region 36). As illustrated, the second surface 34 of the semiconductor device layer 30 is disposed above and adjacent to a semiconductor substrate layer 38 such that the bottom or second surface 34 forms the interface between the drift region 36 and the substrate layer 38. In some embodiments, the semiconductor substrate layer 38 may have the first conductivity type and may be more heavily doped than the drift region 36 (e.g., an n+ substrate layer 38). As illustrated, the substrate layer 38 may form a drain region, wherein a drain contact 40 is disposed below and adjacent to the substrate layer 38.

To increase the current capability of the MOSFET device 20, the MOSFET device 20 may include a plurality of cells 42 connected to one another in parallel. In some embodiments, the cells 42 may be in the shape of a closed figure, such as a square, a hexagon, or any other suitable shape. In certain embodiments, the cells 42 may be longitudinal stripes or segmented longitudinal stripes. Each cell 42 may include a well region 44 having a second conductivity type (e.g., a p-type well region 44) formed in the semiconductor device layer 30 and disposed proximal to the first surface 32. Additionally, each cell 42 may include a source region 46 having the first conductivity type (e.g., n-type source region 46) adjacent to the well region 44 and proximal to the first surface 32. Further, each cell 42 may include a source contact 48 (also referred to as an ohmic contact) disposed above and adjacent to a portion of the first surface 32 of the semiconductor device layer 30. In particular, the source contact 48 is disposed above and adjacent to a portion of the well region 44 and the source region 46. The source contact 48 may be made from one or more metals, such as nickel, tantalum, molybdenum, cobalt, titanium, tungsten, niobium, hafnium, zirconium, vanadium, aluminum, chromium, and/or platinum. For clarity, the portion of the source region 46 disposed below the source contact 48 may be more specifically referred to herein as a source contact region 50. Additionally, the portion of the well region 44 that is more heavily doped with the same conductivity type as the well region 44 and formed below the source contact 48 may be more specifically referred to herein as a body region 52. Further, the portion of the body region 52 that is disposed directly below and adjacent to the source contact 48, thereby forming an interface with the source contact 48, may be more specifically referred to herein as a body contact region 54. The body contact region 54 may be more highly doped (i.e., have a higher doping concentration) than the body region 52 and in some cases can be heavily compensated with the n+ source doping.

Additionally, the MOSFET device 20 may include a plurality of gate electrodes 56 (also referred to as gate metal layer) disposed above portions of the first surface 32 of the semiconductor device layer 30. In particular, each gate electrode 56 may be shared between and may extend across two adjacent (e.g., neighboring) cells 42. As used herein, each cell 42 refers to the structures, regions and features that are repeated throughout the active region of the device 20. For instance, each cell 42 may be defined as the structures from the left most edge of the source contact 48 to the left most edge of the next source contact 48, for instance. The gate electrodes 56 may be made from one or more conductive materials, such as one or more metals, polycrystalline silicon, or any combination thereof. In some embodiments, the gate electrodes 56 may be made from polycrystalline silicon and may be doped (e.g., doped with the first or second conductivity type) to increase the conductivity of the gate electrodes 56 and provide certain threshold voltages. Each gate electrode 56 may be separated from the first surface 32 by a gate dielectric layer 58 (also referred to as a gate insulating layer). Specifically, the gate dielectric layer 58 may be disposed between and adjacent to the gate electrodes 56 and the first surface 32 of the semiconductor device layer 30. In some embodiments, the gate dielectric layer 58 includes an oxide and is referred to as a "gate oxide layer." For example, the gate dielectric layer 58 may include silicon dioxide ($SiO_2$), tantalum oxide ($Ta_2O_5$), alumina ($Al_2O_3$), zirconium oxide ($ZrO_2$), hafnium oxide ($HfO_2$), or other glass-forming materials. In alternate embodiments, the gate dielectric layer 58 may include silicon nitride. As used herein, the "gate stack" refers to the collective combination of the gate electrode 56 formed adjacent and on top of the gate dielectric layer 58.

During on-state operation, an appropriate gate voltage (e.g., at or beyond a threshold voltage ($V_{TH}$) of the MOSFET device 20) applied to the gate electrodes 56 may cause channel regions 60 of the well regions 44 to invert and may cause conductive paths to form, allowing current to flow from the drain contacts 40 to the source contacts 48. The various regions of the MOSFET device 20 may each have an associated resistance, and a total resistance (e.g., an on-state resistance, $R_{ds}$(on)) of the MOSFET device 20 may be represented as a sum of each of these resistances. For example, the on-state resistance of the MOSFET device 20 may be based on a source contact resistance (e.g., the resistances of the source contacts 48, the source contact regions 50, a channel resistance (e.g., the resistance of the channel regions 60), a JFET resistance (e.g., a resistance of the undepleted neck region between well regions 44), a drift resistance (e.g., a resistance of the drift region 36), and a substrate resistance (e.g., a resistance of the substrate layer 38). In certain cases, one or more resistance components may dominate conduction losses, and these factors can significantly impact the on-state resistance of the MOSFET device 20. For example, for devices with low inversion layer mobility (e.g., SiC devices), the channel resistance may account for a significant portion of the device conduction losses. Accordingly, present embodiments can include cellular or stripe cell device designs and layouts that provide heavily doped source regions 46 and body regions 52, decreased channel length, and/or increased channel density (e.g., a greater number of channel regions 60 per unit area of the MOSFET device 20) to reduce on-state resistance and associated conduction losses, as will be described in greater detail below.

Figure 3:
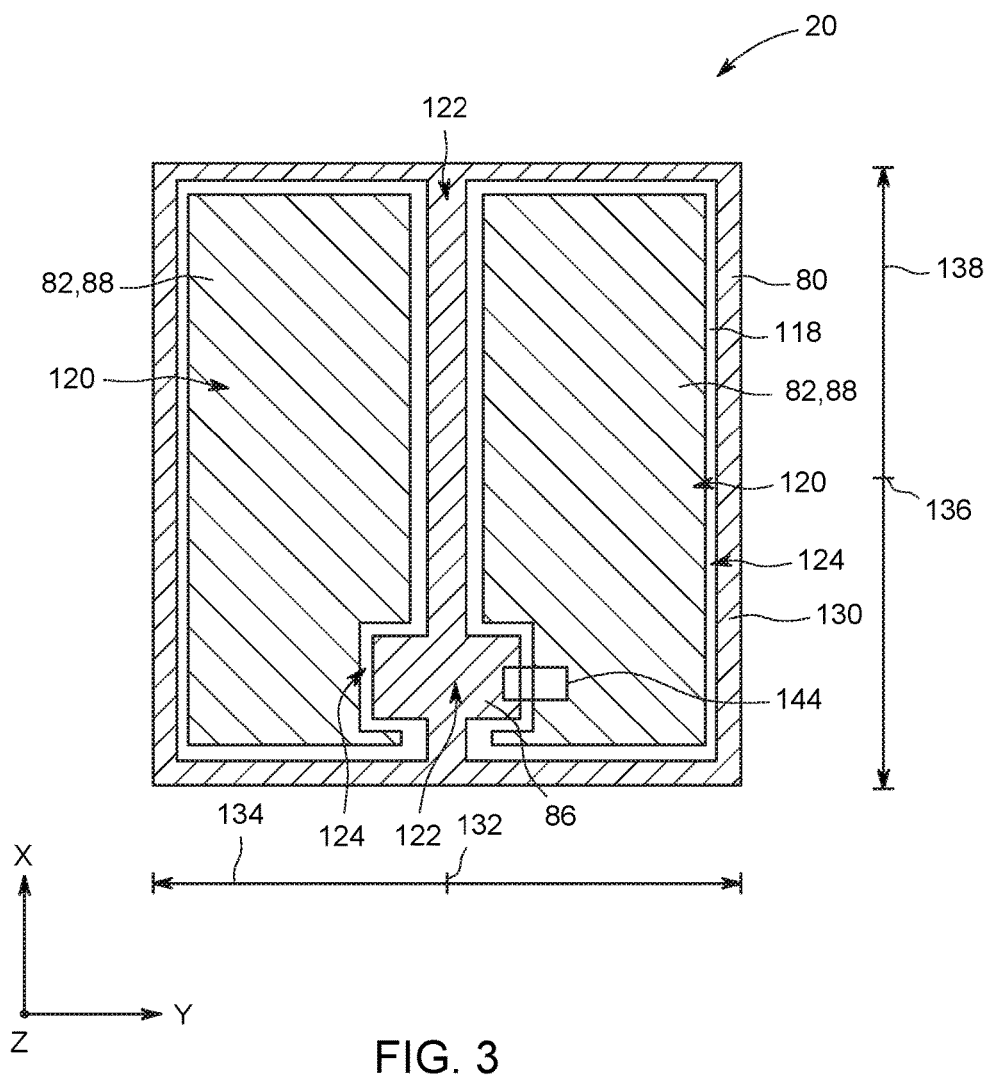
FIG. 3 is a top-down view of the semiconductor device of illustrating a gate metal layer and a source metal layer of the semiconductor device, in accordance with an embodiment of the present disclosure.

FIG. 3 illustrates a top-down or plan view of an embodiment of the MOSFET device 20 including the gate metal layer 80 and the source metal layer 82. The gate metal layer 80 is electrically isolated from the source metal layer 82 by one or more insulating layers 118 (e.g., an interlayer dielectric layer). It should be appreciated that the gate metal layer 80 and the source metal layer 82 may each include one or more metal layers. Further, the gate metal layer 80 and/or the source metal layer 82 may include the same or different materials. In some embodiments, the gate metal layer 80 and the source metal layer 82 may include one or more metals, such as nickel, tantalum, molybdenum, cobalt, titanium, tungsten, niobium, hafnium, zirconium, vanadium, aluminum, chromium, and/or platinum. Similarly, the device 20 may include a drain metal layer (not illustrated), as will be appreciated by those skilled in the art.

The gate metal layer 80 and the source metal layer 82 are conductively coupled to or include (e.g., integrally formed with) its associated contacts (e.g., the gate electrodes 56 or the source contacts 48, respectively) of the cells 42 (shown in FIG. 2) of the MOSFET device 20. For example, as discussed below, the source metal layer 82 may extend through one or more contact vias (e.g., openings) formed in one or more insulating layers of the MOSFET device 20 to conductively couple to (e.g., directly contact) the source contacts 48. In some embodiments, as discussed below, the gate metal layer 80 is a portion of the pad metal that may extend through one or more contact vias formed in one or more insulating layers of the MOSFET device 20 to conductively couple to (e.g., directly and/or indirectly contact) the gate electrodes 56.

Generally, the MOSFET device 20 includes an active region 120 below the source metal layer 82 (e.g., along the z-direction). The active region 120 includes the cells 42 (shown in FIG. 2) of the MOSFET device 20. As discussed in more detail below, the source metal layer 82 may extend through contact vias in the one or more insulating layers 118 to directly contact the source contacts 48 of the cells 42. For clarity, the area or region of the MOSFET device 20 located below the gate metal layer 80 (e.g., along the z-direction) may be referred to as a gate metal contact region 122 (e.g., gate pad contact region). Additionally, the area or region of the MOSFET device 20 located between the active region 120 and the gate metal contact region 122 (e.g., along the x-direction and/or the y-direction) may be referred to as a gate metal connection region 124 (e.g., gate metal integration region). In other words, the gate metal connection region 124 is disposed between the gate metal layer 80 and the source metal layer 82, connecting the gate pad 86 or gate runners 130 (described below) to the gate electrodes 56 or stack in the active regions 120. However, it should be appreciated that in some embodiments, the source metal layer 82 may be disposed above portions of the gate metal connection region 124, for example, if the active region 120 does not extend across the entirety of the source metal layer 82. Further, the gate metal contact region 122 and the gate metal connection region 124 may be collectively referred to as a gate metal region 126 (as illustrated in FIG. 4) of the MOSFET device 20.

As illustrated, the gate metal layer 80 includes the gate pad 86 (also referred to as a gate contact pad or a gate bond pad) and a gate runner 130 (e.g., a gate bus) conductively coupled to (e.g., in direct contact with) the gate pad 86. In some embodiments, as illustrated, the gate runner 130 may extend from the gate pad 86 along the x-direction and may extend around a periphery (e.g., perimeter) of the MOSFET device 10. In other embodiments, the gate runner 130 may only run down the center of the active region 120. Further, as illustrated, the source metal layer 82 may include two source pads 88 (also referred to as a source contact pad or a source bond pad). It should be appreciated that the gate metal layer 80 (e.g., the gate pad 86 and the gate runner 130) and the source metal layer 82 (e.g., the source pads 88) may have any suitable layout or configuration. For example, in some embodiments, the gate pad 86 may be generally aligned with a midpoint 132 of a length 134 of the MOSFET device 20 and may be offset from a midpoint 136 of a width 138 of the MOSFET device 20, or vice versa. In other embodiments, the gate pad 86 may be generally centered about the MOSFET device 20 (e.g., aligned with the midpoint 132 of the length 134 and aligned with the midpoint 136 of the width 138). In certain embodiments, the gate pad 86 may be offset from the midpoint 132 of the length 134 and the midpoint 136 of the width 138.

Figure 4:
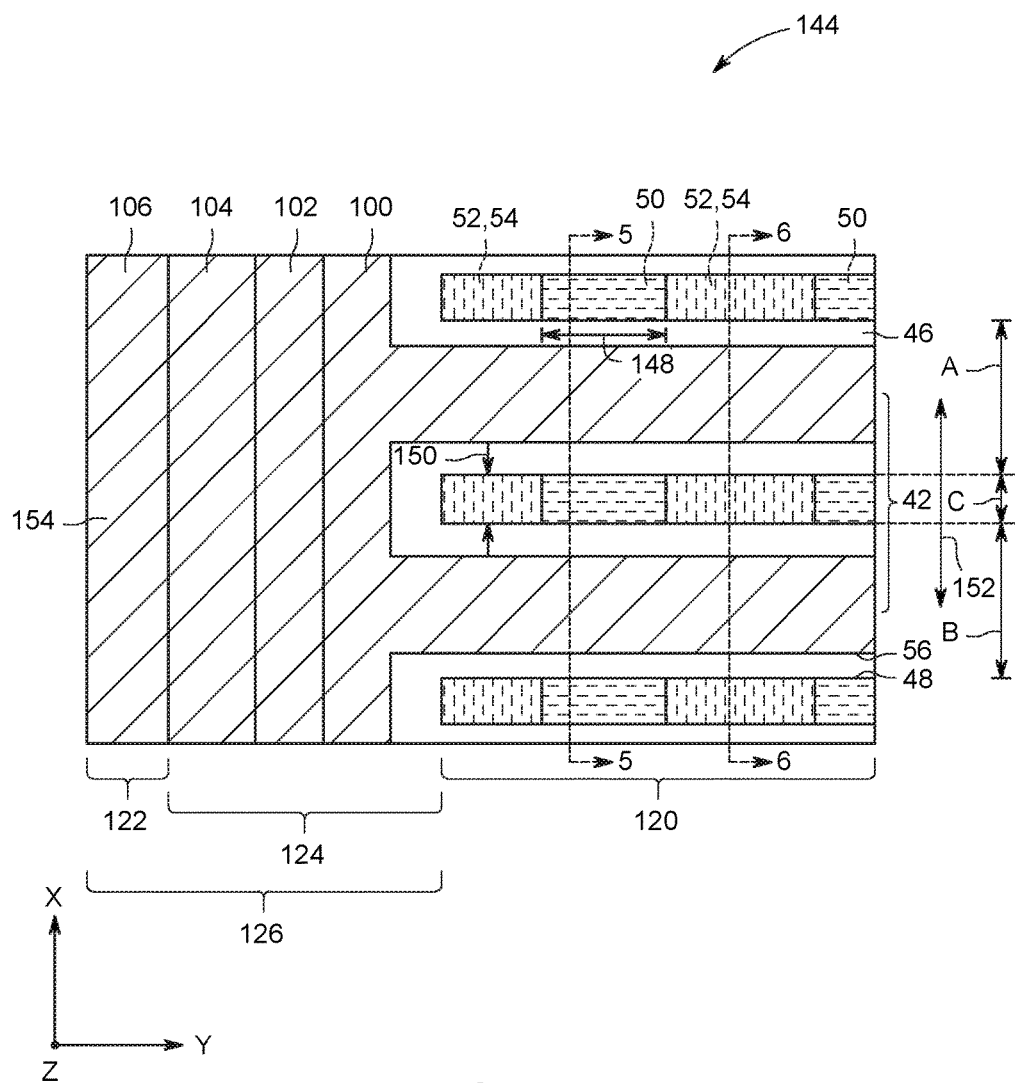
FIG. 4 is an enlarged view of a region of the semiconductor device of FIG. 3, illustrating an active region, a gate contact region, and a gate connection region of the semiconductor device, in accordance with an embodiment of the present disclosure.

FIG. 4 illustrates an enlarged top down view of the MOSFET device 20 taken within region 144 of FIG. 3 illustrating the gate metal contact region 122, the gate metal connection region 124, and the active region 120. It should be appreciated that the gate metal layer 80 and the insulating layers 118 are omitted from FIG. 4 in order to illustrate the gate metal contact region 122, the gate metal connection region 124, and the active region 120. As illustrated, the active region 120 includes the source contacts 48 and the gate electrodes 56 of the cells 42 (e.g., stripe cells or longitudinal cells).

As discussed above with respect to FIG. 2, the source region 46 and the body region 52 of each cell 42 may be disposed below the source contact 48 of the respective cell 42, and more specifically, the source contact region 50 and the body contact region 54 of the source region 46 and the body region 52, respectively, may be disposed below and adjacent to the respective source contact 48. In some embodiments, each cell 42 may include a plurality of segmented body regions 52 that are spaced apart from one another along the cell length (e.g., along the y-direction) by a distance 148 (e.g., a longitudinal distance). The distance 148 may be constant or variable along the cell length. Accordingly, the source contact regions 50 and the body contact regions 54 may be segmented in embodiments having the segmented body regions 52. It should be appreciated that the segmented source contact regions 50, the segmented body regions 52, and the segmented body contact regions 54 are illustrated by dashed lines to indicate that the regions are disposed below the source contacts 48. As a result, the source contact 48 of each cell 42 may contact both the source contact regions 50 and the body contact regions 54 along the cell length, which may enable a width 150 of each source contact 48 to be reduced or minimized, and therefore a width 152 of each cell 42 to be reduced or minimized, as compared to cells that do not include segmented source contact regions 50 and segmented body contact regions 54. Decreasing the width 152 of the cells 42 may enable a higher cell density of the MOSFET device 20 and thus a higher current capacity. Further, decreasing the width 152 of the cells 42 may enable an increase of periphery of the channel regions 60 (shown in FIG. 2) and/or a higher density of the channel regions 60 and JFET regions 62, which may reduce the on-state resistance of the MOSFET device 20. Further, as discussed below, the segmented source regions 46 and the segmented body regions 52 may be heavily doped to reduce the ohmic contact resistance and the source contact resistance.

As illustrated, the gate metal region 126 may include a gate connection region 154 (e.g., a gate extension) configured to provide a conductive path between the gate metal layer 80 (e.g., the gate pad 86 and/or the gate runner 130) and the gate electrodes 56 of the cells 42. In particular, the gate connection region 154 may be directly coupled to and disposed between the gate electrodes 56 and the gate metal layer 80. In some embodiments, the gate connection region 154 and the gate electrodes 56 may be formed from the same material or materials. In certain embodiments, the gate connection region 154 and the gate electrodes 56 may be continuous with one another and may be formed simultaneously. For example, in some embodiments, the gate connection region 154 and the gate electrodes 56 may be formed by depositing a gate material on a surface of the MOSFET device 20 and subsequently etching the deposited gate material to form the gate connection region 154 and the gate electrodes 56. In some embodiments, the gate connection region 154 and the gate electrodes 56 may be formed by depositing a gate material on a surface of the MOSFET device 20 using lithographic (e.g., patterning) processes. Additionally, as discussed below, the gate metal layer 80 may extend through one or more contact vias formed through the insulating layer 118 in the gate metal contact region 152 to directly contact the gate connection region 154.

Also illustrated, are the regions 100, 102, 104 and 106. The region 100 represents where the gate metal layer 80 is on top of the gate oxide layer 58 and the n+ source region 46. The region 102 represents where the gate metal layer 80 is over the field oxide 200 (which will be described with respect to FIGS. 8 and 9 below), the gate oxide layer 58, the n+ source region 46 and the p+ body region 52. The region 104 represents where the gate metal layer 80 is over the field oxide 200, the gate oxide layer 58 and the p+ body region 52. The region 106 represents where gate metal layer 80 is over the field oxide 200 and the gate oxide layer 58.

Figure 5:
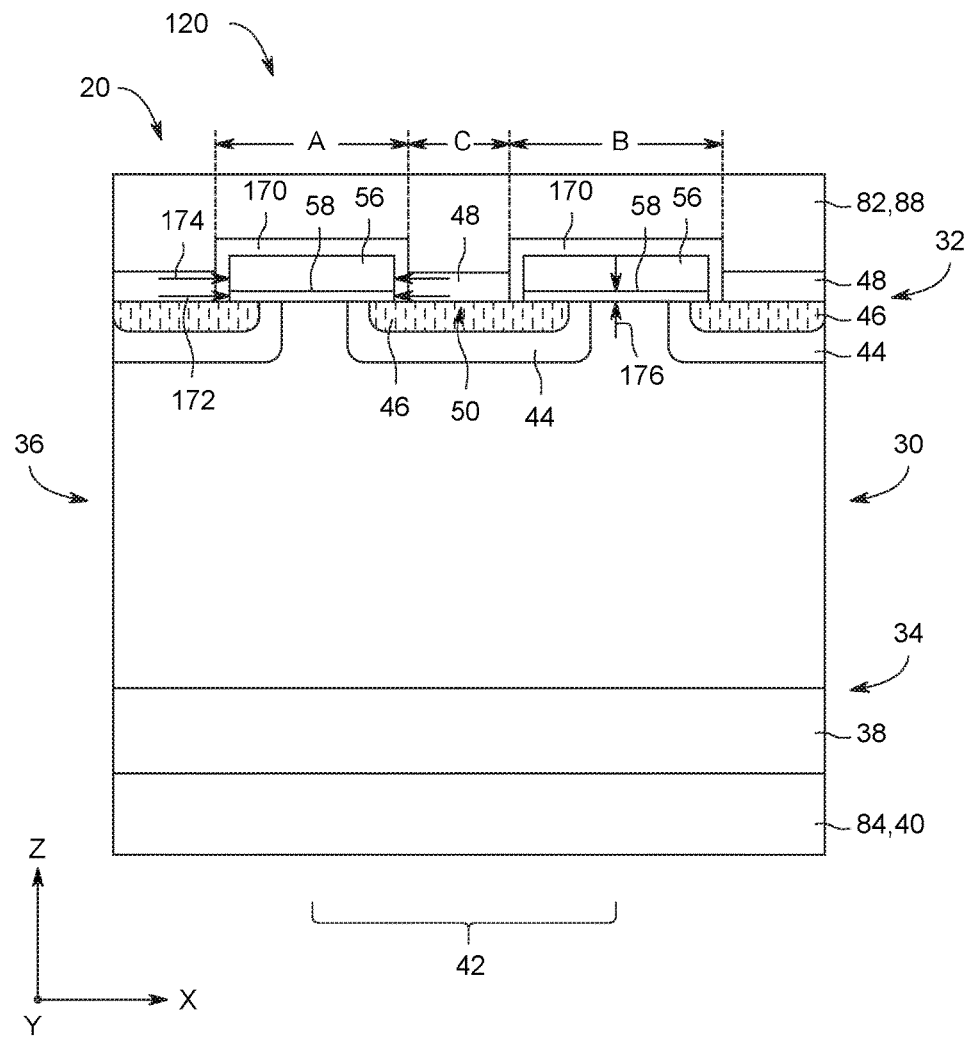
FIG. 5 is a schematic cross-section of the active region of the semiconductor device taken along line 5-5 of FIG. 4, in accordance with an embodiment of the present disclosure.

FIG. 5 is a schematic cross-section of the active region 120 of the MOSFET device 20 taken along line 5-5 of FIG. 4. In particular, FIG. 5 illustrates a cross-section of the MOSFET device 20 taken across the segmented source contact regions 50 of the cells 42. That is, the segmented body regions 52 and the segmented body contact regions 54 are not present in the cross-section illustrated in FIG. 5. As illustrated, the source metal layer 82 (e.g., the source pad 88) is disposed on and adjacent to the source contacts 48 in the active region 120. For reference, region A, region B and region C are illustrated in FIGS. 4 and 5. Regions A and B represent the cross-sectional widths of the gate electrodes 56 and surrounding dielectric layer 170 of adjacent cells 42 in a lateral direction (e.g., the x-direction). Region C represents the width of the source contact 48 between the regions A and B.

As illustrated, the gate electrodes 56 are electrically isolated from the source metal layer 82 and the source contacts 48 by a dielectric layer 170 (e.g., an interlayer dielectric layer (ILD)). Further, the gate electrodes 56 are electrically isolated from regions of the semiconductor device layer 30, such as the source regions 46 and the well regions 44, by the gate oxide layer 58. As illustrated, in some embodiments, a width 172 of the gate oxide layer 58 below each gate electrode 56 may be approximately equal to a width 174 of the respective gate electrode 56. In some embodiments, the width 172 of the gate oxide layer 58 which is disposed below each gate electrode 56 may be greater than the width 174 of the respective gate electrode 56. The gate oxide layer 58 may also be associated with a thickness 176 (e.g., height). In certain embodiments, the thickness 176 of the gate oxide layer 58 may be between approximately 10 nanometers (nm) and approximately 100 nm, between approximately 20 nm and approximately 90 nm, or between approximately 30 nm and approximately 80 nm. In certain embodiments, the thickness 176 of the gate oxide layer 58 may be less than or equal to approximately 80 nm, approximately 70 nm, approximately 60 nm, approximately 50 nm, approximately 40 nm, or approximately 30 nm.

Figure 6:
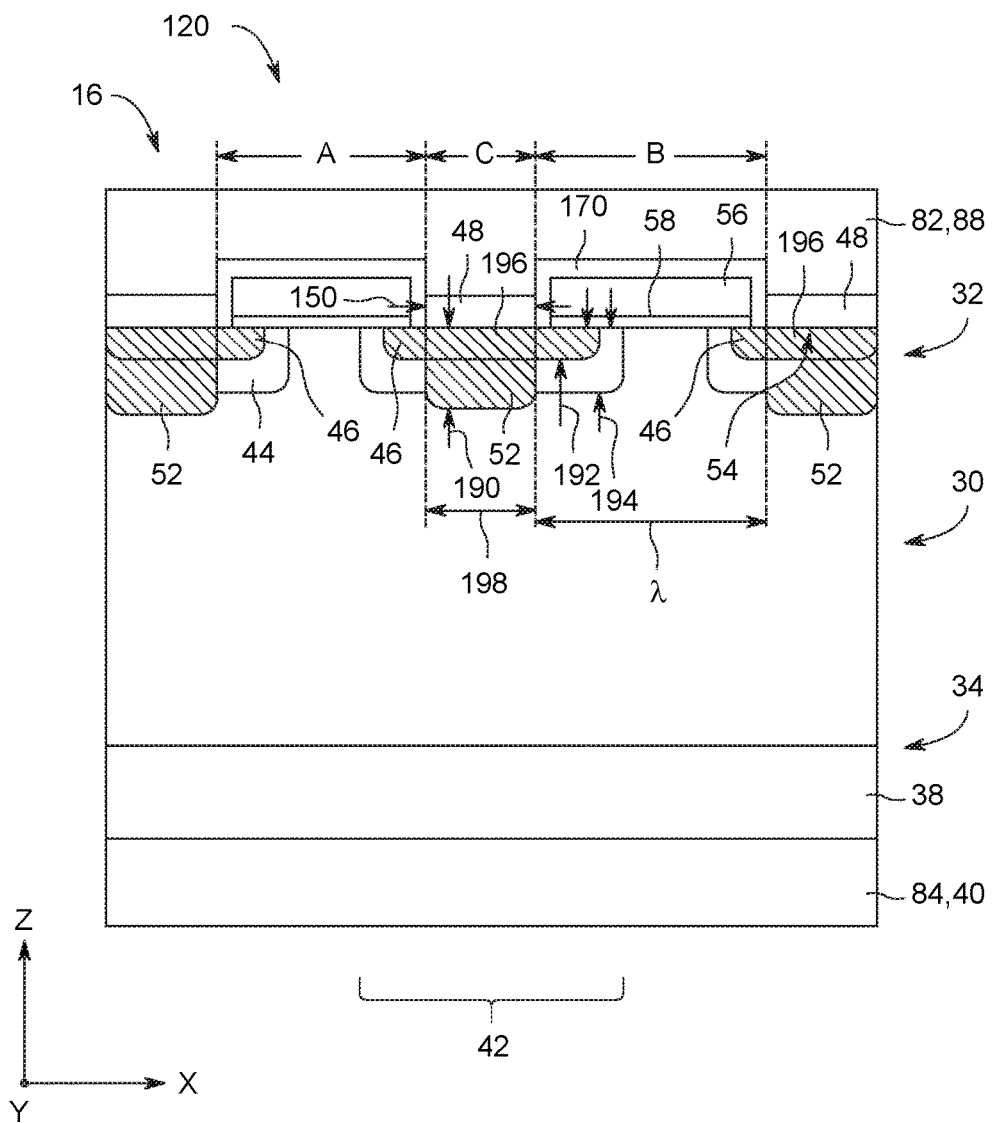
FIG. 6 illustrates a schematic cross-section of the active region of the semiconductor device taken along line 6-6 of FIG. 4, in accordance with an embodiment of the present disclosure.

FIG. 6 illustrates a schematic cross-section of the active region 120 of the MOSFET device 20 taken along line 6-6 of FIG. 4. In particular, FIG. 6 illustrates a cross-section of the MOSFET device 20 taken across the segmented body regions 52 of the cells 42. Regions A, B and C are also depicted. In some embodiments, the segmented body regions 52 may be formed by implanting dopants of the second conductivity type (e.g., p-type) into the source regions 46 and the well regions 44. That is, each segmented body region 52 may have a depth 190 (e.g., a thickness) that is greater than a depth 192 of the source regions 46 and may extend past the source regions 46 into the well regions 44. As previously described, the doping concentration of the body region 52 is higher than the doping concentrations of the source regions 46 and the well regions 44. Further, in certain embodiments, the depth 190 of the segmented body regions 52 may be greater than a depth 194 of the well regions 44 to increase the robustness of the MOSFET device 20 under avalanche breakdown.

Additionally, each segmented body region 52 may include a compensated body region 196 that includes the source region doping (e.g., n-type). As used herein, the term "compensated regions" refers to regions of the semiconductor device layer that are implanted using at least two different implantations of opposite conductivity types (e.g., $N_a$ and $N_d$), and, as such, the compensated regions have a net doping concentration of: $N_a$–$N_d$, plus or minus the doping concentration of the epi layer ($N_{epi}$). In particular, the net doping concentration may be determined as the sum ($\Sigma$) of the dose of each doping process, wherein doses of the first conductivity type and the second conductivity type are afforded opposite (i.e., positive, negative) signs. For example, the semiconductor device layer 30 and the source regions 46 may both have the first conductivity type (e.g., n-type) and may have doping concentrations of $N_{epi}$ and $N_d$, respectively. Additionally, the segmented body regions 52 may have the second conductivity type (e.g., p-type) and may have doping concentrations of $N_a$. As such, the segmented compensated body regions 196 may have a net doping concentration of $N_a$–$N_d$–$N_{epi}$.

In particular, the doping concentration of the body regions 52 is greater than the doping concentration of the source regions 46, thus compensating the source regions 46 to create the compensated body regions 196. In some embodiments, the doping concentration of the body regions 52 may be greater than or equal to approximately $1 \times 10^{19}$ cm$^{-3}$. In certain embodiments, the doping concentration of the body regions 52 may be between approximately $1 \times 10^{18}$ cm$^{-3}$ and approximately $1 \times 10^{21}$ cm$^{-3}$ or between approximately $1 \times 10^{19}$ cm$^{-3}$ and approximately $1 \times 10^{21}$ cm$^{-3}$. In certain embodiments, the doping concentration of the source regions 46 may be between approximately $1 \times 10^{17}$ cm$^{-3}$ and approximately $1 \times 10^{19}$ cm$^{-3}$. As used herein, the "heavily doped" regions (e.g., the source regions 46 and the body regions 52) have a doping concentration in the range of $1 \times 10^{17}$ cm$^{-3}$ and approximately $1 \times 10^{21}$ cm$^{-3}$. In contrast, as used herein, the "lightly doped" regions (e.g., the drift regions 36 and the well regions 44) have a doping concentration in the range of approximately $1 \times 10^{15}$ cm$^{-3}$ to below $1 \times 10^{17}$ cm$^{-3}$.

Additionally, each segmented body region 52 may have a width 198, and the segmented body regions 52 in adjacent (e.g., neighboring) cells 42 may be spaced apart from one another by a lateral distance or dimension $\lambda$ (e.g., the x-direction). The lateral dimension λ depicts the largest distance between segmented p+ body regions 52 in the active region 120 of the MOSFET device 20 and may be referred to herein as the "lateral body region spacing," or designated simply by the symbol "λ". In some embodiments, as illustrated, the width 198 of each segmented body regions 52 may be approximately equal to the width 150 (shown in FIG. 4) of each source contact 48.

Figure 7:
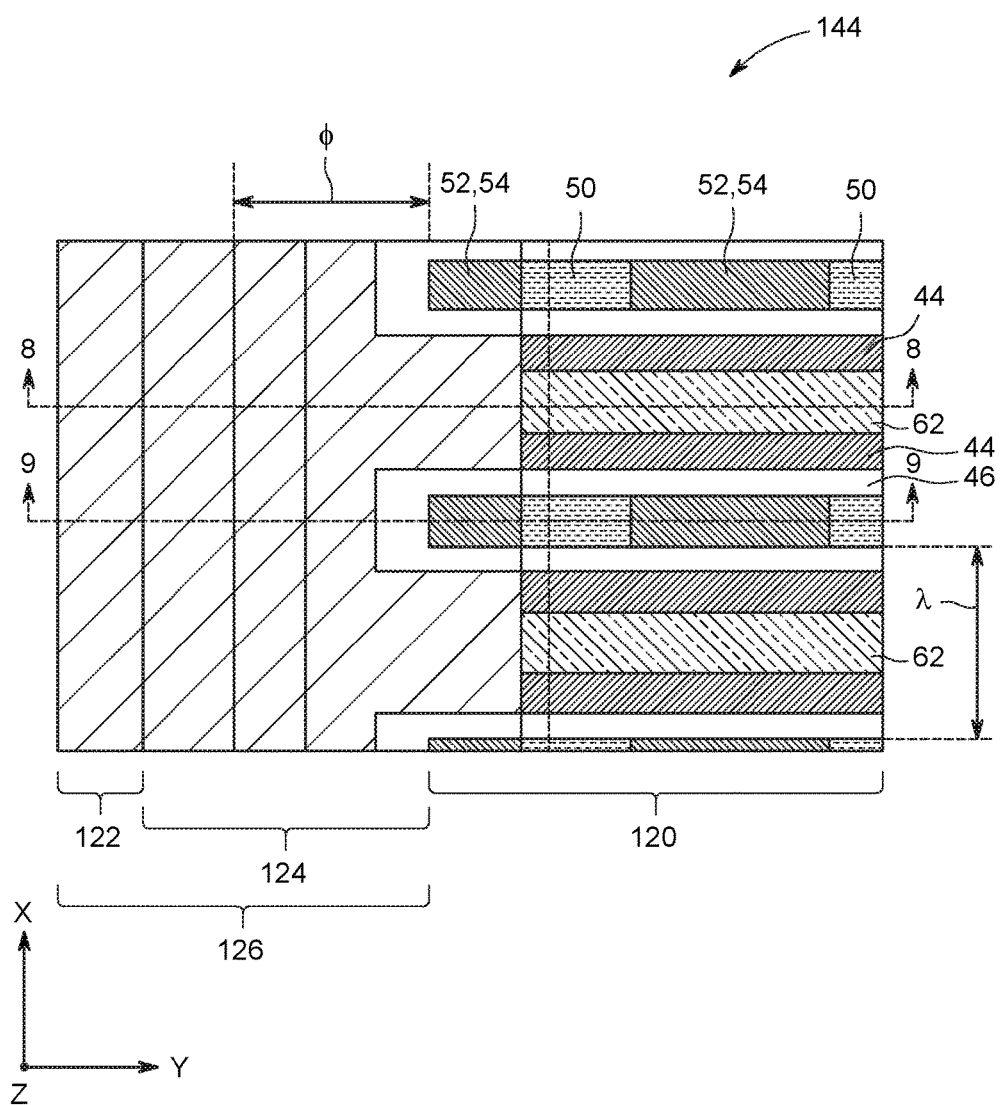
FIG. 7 is a view of a region of the semiconductor device of FIG. 3, illustrating various features of the semiconductor device, in accordance with an embodiment of the present disclosure.

Similar to FIG. 4, FIG. 7 illustrates an enlarged top down view of the MOSFET device 20 taken within region 144 of FIG. 3 illustrating the gate metal contact region 122, the gate metal connection region 124, and the active region 120. FIG. 7 has been modified from FIG. 4 to illustrate other features of the area 144, and the device 20 in accordance with embodiments of the invention. Specifically, FIG. 7 depicts the well regions 44 and JFET regions 62, in addition to the regions previously discussed with regard to FIG. 4. Further, FIG. 7 illustrates the dimension λ, described above, as well as the longitudinal dimension φ (e.g., the y-direction). As will be discussed further below with reference to FIG. 9, the longitudinal dimension φ represents the distance from the last active segmented p+ body region 52 to the p+ region under the gate pad 86 and gate runner 130 (as illustrated in FIGS. 7 and 9) or it may refer to the distance from the last active segmented p+ body region 52 and the outer edge of the active region 120 (away from the gate pad 86) and the underlying heavily doped p+ region at the edge of the MOSFET device 120 (as can be seen at the edge of outer edge of the illustration in FIG. 3). As will be appreciated, both of these distances are equal and thus, may each be designated well as the longitudinal dimension φ. The longitudinal dimension φ may be referred to herein as the "longitudinal body region to edge spacing." Finally, FIG. 7 also includes cross-sectional cut lines 8-8 and 9-9 which correspond to FIGS. 8 and 9, respectively.

Figure 8:
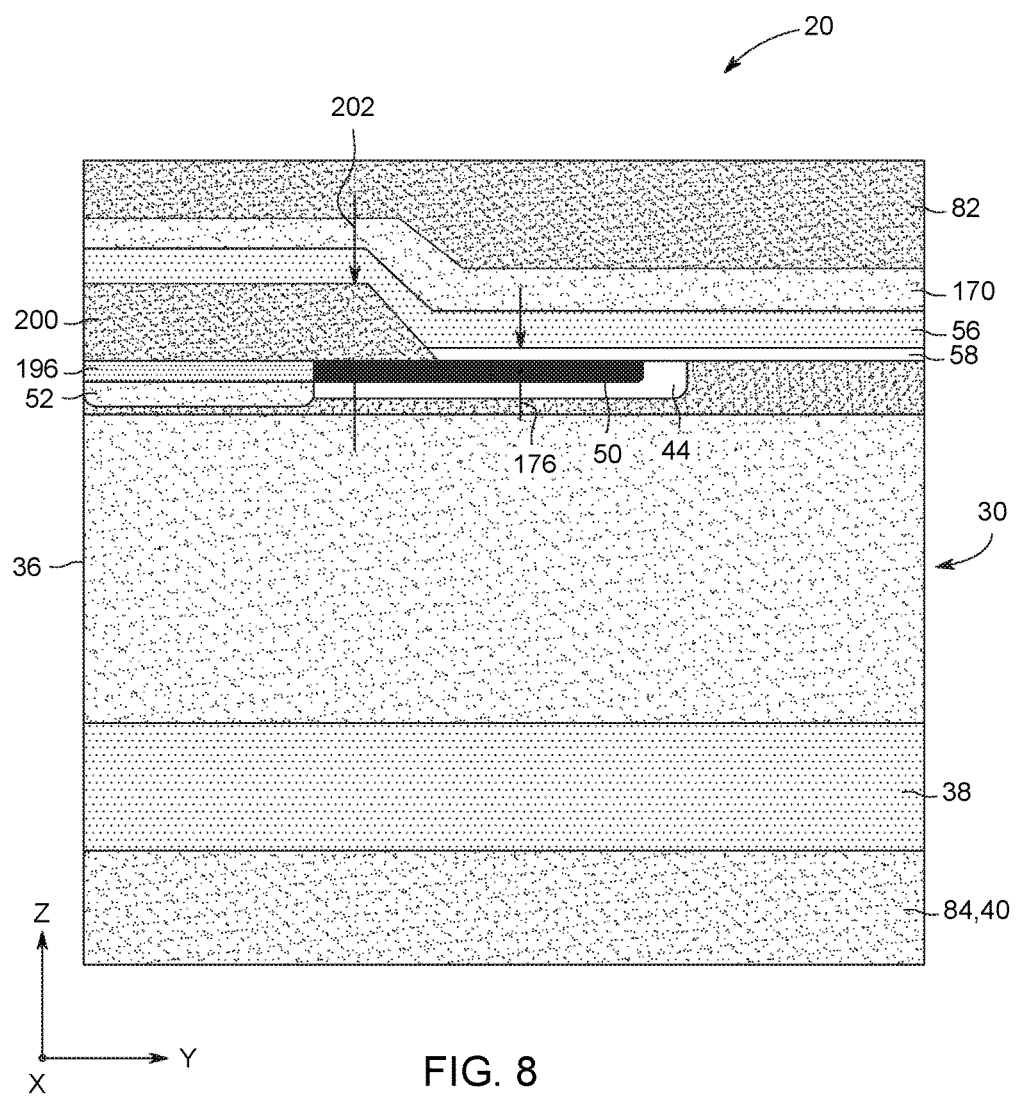
FIG. 8 is a schematic cross-section through the JFET regions of the semiconductor device taken along line 8-8 of FIG. 7, in accordance with an embodiment.
Figure 9:
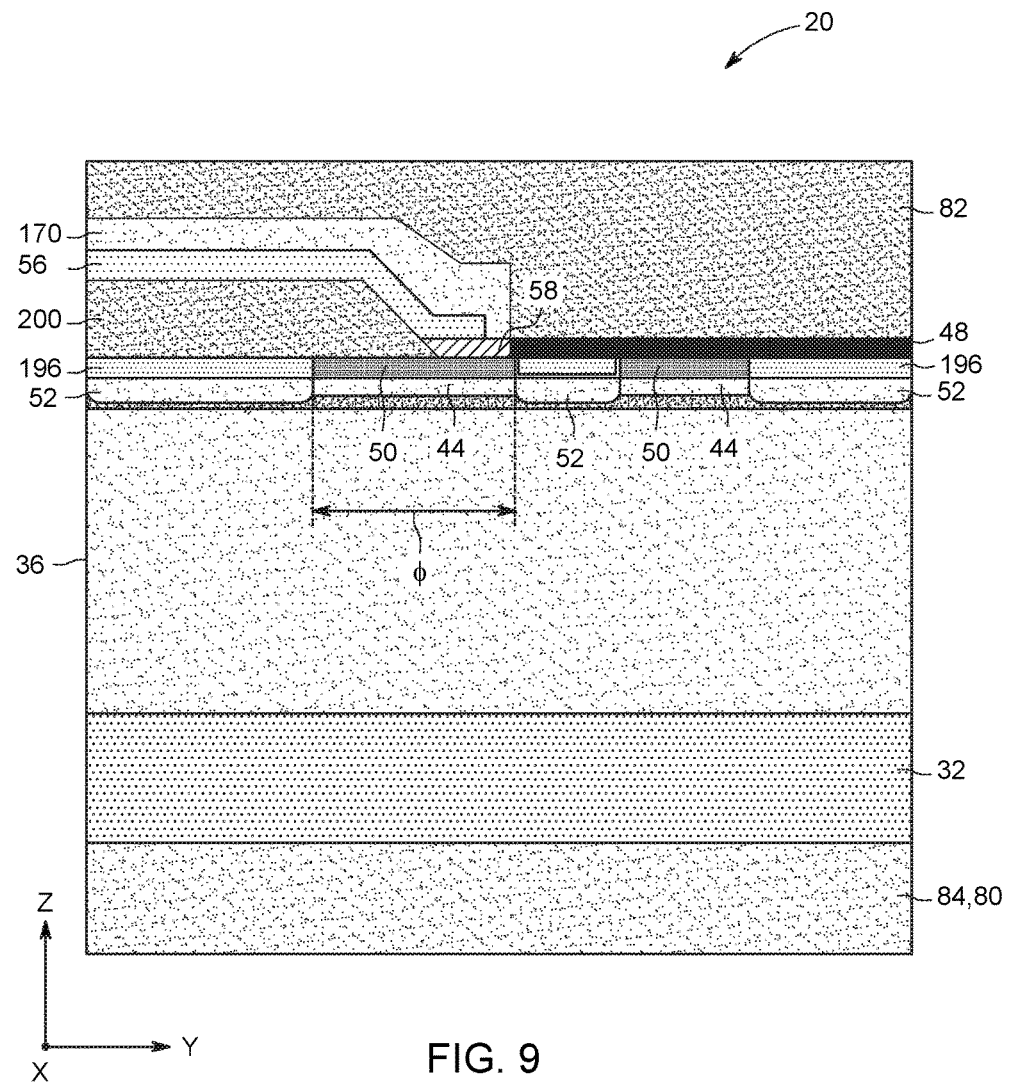
FIG. 9 is a schematic cross-section through the gate pad and source contact of the semiconductor device taken along line 9-9 of FIG. 7, in accordance with an embodiment.

Turning now to FIGS. 8 and 9, various features of the disclosed MOSFET device 20 layout are illustrated, in accordance with embodiments of the present invention. FIG. 8 is a schematic cross-section of the MOSFET device 20 taken along line 8-8 of FIG. 7. In particular, FIG. 8 illustrates a cross-section of the MOSFET device 20 taken along the longitudinal direction (e.g., the y-direction) through the JFET regions 62 of the stripe cells 42. Thus, the source contacts 48 are not present in the cross-section illustrated in FIG. 8. FIG. 9 is a schematic cross-section of the MOSFET device 20 taken along line 9-9 of FIG. 7. In particular, FIG. 9 illustrates a cross-section of the MOSFET device 20 taken along the longitudinal direction (e.g., the y-direction) through the gate pad 86 of the gate metal layer 80 and through the source contact 48 of the stripe cells 42.

As previously discussed with regard to FIGS. 4-6, the gate metal layer 80 that forms the gate electrode 56 is generally disposed on top of and directly adjacent to a relatively thin gate dielectric layer 58 (e.g., approximately 30 nm-80 nm in thickness 176) and disposed, in part, above n+ source regions 46, p-well regions 44 and JFET regions 62 in SiC planar-channel MOSFET devices, such as the MOSFET device 20. At the ends of the stripe cells 42 there is an termination region wherein the active cells are terminated/ integrated with other device functional (inactive or non-channel conducting) areas such as the gate metal contact region 122 or bussing structures, such as the gate runner 130 that are utilized to spread the current or maintain the potential more evenly throughout the MOSFET device 20. FIGS. 8 and 9 illustrate examples of these termination/ integration regions.

As illustrated in the disclosed embodiments, the gate stack (i.e., the gate electrode 56 and gate dielectric 58) is not disposed directly adjacent and over heavily doped p+ body regions 52 (and compensated body regions 196) in any portion of the disclosed SiC MOSFET device 20. That is, as illustrated in FIGS. 8 and 9, the portions of the gate metal layer 80 that are adjacent and on top of the gate dielectric layer 58, forming the gate stack, are not formed directly adjacent to the highly doped p+ body region 52 and compensated body region 196. In other words, the MOSFET device 120 does not include any gate electrodes 56 that are formed over both the gate dielectric layer 58 and the heavily doped p+ body region 52 and compensated body region 196. Advantageously, this particular feature provides for a MOSFET device 20 with better gate-reliability than previous designs.

As also illustrated in FIGS. 8 and 9, a field oxide layer 200 is used. As will be appreciated, the field oxide layer 200 in a semiconductor device, such as the MOSFET device 20, is typically provided to isolate (electrically de-couple) source and gate metals from the underlying semiconductor areas and provide passivation over termination regions. As will also be appreciated, the thickness 202 of the field oxide layer 200 (depicted in FIG. 8) is significantly greater than the thickness 176 of the gate dielectric layer 58 (depicted in FIG. 8) and avoid the formation of parasitic channels or paths in the underlying semiconductor areas, while ensuring proper control of the MOSFET device 20 through the thinner gate dielectric layer 58, during operation. For instance, the thickness 202 of the field oxide layer 200 may be in the range of greater than about 0.5 μm, or in some embodiments, approximately 0.5 μm-1 μm, reducing the electric field in this region by 10-20 times compared to that in the thinner gate dielectric layer 58 at the same bias.

To achieve the disclosed layout of the MOSFET device 20, wherein the gate stack (consisting of the gate electrode 56 formed adjacent to and on top of the gate dielectric layer 58) is not adjacent to (i.e., not in direct contact with) the heavily doped p+ body region 52 and compensated body region 196, the step edge of the field oxide layer 200 is disposed above the heavily doped portions of the p-well region 44 and the self-aligned n+source region 46 (i.e., the heavily doped p+ body region 52 and compensated body region 196). Thus, the region where the n+ source region 46 and the p-well region 44 is directly adjacent with the heavily doped p+ body region 52 and compensated body region 196 occurs under the region where the gate electrode 56 is disposed atop the field oxide layer 200 and the thin gate dielectric layer 58. That is, the field oxide layer 200 extends longitudinally (e.g., the y-direction) beyond the end of the p+ body region 52 and compensated body region 196 such that the gate stack is not formed adjacent to these regions.

Further, and as previously discussed and illustrated FIG. 9, to maintain the robustness of the SiC MOSFET device 20 (e.g. avalanche ruggedness), the spacing between the p+ body of the last segment in the active cell stripe and the p+ regions in the peripheral/termination and pad areas (and around the periphery of the active region) should be kept equal to or below the spacing of the p+ body segments in the active region. That is, the longitudinal segmented body region edge spacing φ, is less than or equal to the lateral body region spacing λ. In one embodiment, the longitudinal segmented body region edge spacing φ, is in the range of approximately 3 μm-5 μm. This design prevents localization of avalanche points near the asymmetries wherein the active cells are terminated. It also ensures that the devices do not suffer parasitic latch-up under high dV/dt associated with the fast switching speeds of the SiC MOSFET device 20 (e.g. dV/dt>50-100V/ns). While not illustrated in FIG. 9, it should be appreciated that the same spacing ϕ, exists at the edge of the active region 120 opposite the gate metal 122 illustrated in FIGS. 3, 4 and 7, at the furthest edge from the gate metal contact region 120 (e.g., the gate runner 130) at the opposite ends of the stripe cells 42. Again, the longitudinal segmented body region edge spacing ϕ at the outer edges will also be less than or equal to the lateral body region spacing λ, in accordance with present embodiments.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A semiconductor device comprising:
   a substrate;
   a first stripe of cells arranged in a longitudinal direction through an active region formed on the substrate, wherein each cell of the first stripe of cells comprises a heavily doped body region;
   a second stripe of cells formed parallel to the first stripe of cells through the active region formed on the substrate, wherein the second stripe of cells is spaced laterally from the first stripe of cells, and wherein each cell of the second stripe of cells comprises a heavily doped body region;
   a termination region having a heavily doped region formed proximal to an end of each of the first and second stripe of cells and spaced at a longitudinal body region to edge spacing (ϕ);
   wherein the heavily doped body region of each cell in the first stripe of cells is spaced at a lateral body region spacing (λ) from a respective heavily doped body region of each cell in the second stripe of cells; and
   wherein the longitudinal body region to edge spacing (ϕ) is less than or equal to the lateral body region spacing (λ).

2. The semiconductor device of claim 1, wherein the termination region is formed under a gate metal pad region.

3. The semiconductor device of claim 1, wherein the termination region is formed under a gate bus that provides a low impedance path throughout the majority of the semiconductor device.

4. The semiconductor device of claim 1, wherein the termination region is formed at an end of the first and second stripe of cells, opposite a gate metal contact region.

5. The semiconductor device of claim 1, wherein a longitudinal segmented body region edge spacing ϕ is in a range of approximately 3 μm-5 μm.

\* \* \* \* \*